United States Patent
Kang et al.

(10) Patent No.: US 12,147,264 B2
(45) Date of Patent: Nov. 19, 2024

(54) CLOCK DISTRIBUTION CIRCUIT AND SEMICONDUCTOR APPARATUS INCLUDING THE SAME PRELIMINARY CLASS

(71) Applicant: SK hynix Inc., Icheon-si (KR)

(72) Inventors: Ji Hyo Kang, Icheon-si (KR); Kyung Hoon Kim, Icheon-si (KR); Jae Hyeok Yang, Icheon-si (KR); Sang Yeon Byeon, Icheon-si (KR); Gang Sik Lee, Icheon-si (KR); Joo Hyung Chae, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 64 days.

(21) Appl. No.: 18/183,799

(22) Filed: Mar. 14, 2023

(65) Prior Publication Data

US 2023/0213961 A1 Jul. 6, 2023

Related U.S. Application Data

(63) Continuation-in-part of application No. 17/226,952, filed on Apr. 9, 2021, now Pat. No. 11,625,062.

(30) Foreign Application Priority Data

Nov. 19, 2020 (KR) .................. 10-2020-0155737

(51) Int. Cl.
*G06F 1/10* (2006.01)
*G11C 7/22* (2006.01)
*H03K 19/00* (2006.01)

(52) U.S. Cl.
CPC ............... *G06F 1/10* (2013.01); *G11C 7/222* (2013.01); *H03K 19/0016* (2013.01)

(58) Field of Classification Search
CPC ........................................................ G06F 1/10
USPC ......................................................... 327/291
See application file for complete search history.

(56) References Cited

U.S. PATENT DOCUMENTS 5,790,839 A 8/1998 Luk et al.
2019/0253055 A1* 8/2019 Jang .................... G06F 1/10

* cited by examiner

*Primary Examiner* — Tomi Skibinski
(74) *Attorney, Agent, or Firm* — WILLIAM PARK & ASSOCIATES LTD.

(57) ABSTRACT

A clock distribution circuit includes a global distribution circuit, a first local distribution circuit and a second local distribution circuit. The global distribution circuit receives external clock signals and generates internal clock signals and primary reference clock signal set according to the external clock signals. The first local distribution circuit receives the internal clock signals and the primary reference clock signal set and generates a secondary reference clock signal set according to the internal clock signals and the primary reference clock signal set. The second local distribution circuit receives the internal clock signals and the secondary reference clock signal set and generates a thirdly reference clock signal set according to the internal clock signals and the secondary reference clock signal set.

14 Claims, 12 Drawing Sheets

CLOCK DISTRIBUTION CIRCUIT AND SEMICONDUCTOR APPARATUS INCLUDING THE SAME PRELIMINARY CLASS

CROSS-REFERENCES TO RELATED APPLICATION

This application is a continuation-in-part of U.S. application Ser. No. 17/226,952 filed on Apr. 9, 2021, entitled "CLOCK DISTRIBUTION CIRCUIT AND SEMICONDUCTOR APPARATUS INCLUDING THE SAME", which claims priority under 35 U.S.C. § 119(a) to Korean Application No. 10-2020-0155737, filed on Nov. 19, 2020, in the Korean Intellectual Property Office, which is incorporated herein by reference in its entirety.

BACKGROUND

1. Technical Field

Various embodiments generally relate to a semiconductor circuit, and particularly, to a clock distribution circuit and a semiconductor apparatus including the same.

2. Related Art

A semiconductor apparatus includes a clock distribution circuit for distributing external clock signals, for example, clock signals provided from a host, to various internal circuit configurations.

Since the clock distribution circuit needs to receive the external clock signals and distribute the external clock signals to each of input/output terminals, power consumption may be considerable and a skew problem may occur in a transmission process.

SUMMARY

Various embodiments are directed to providing a clock distribution circuit capable of reducing power consumption and a skew and a semiconductor apparatus including the same.

In an embodiment, a clock distribution circuit may include: a global distribution circuit and a local distribution circuit. The global distribution circuit may be configured to divide external clock signals to generate first divided multiphase clock signals and divide any one of the first divided multiphase clock signals to generate a reference clock signal. The local distribution circuit may be configured to generate second divided multiphase clock signals according to a portion of the first divided multiphase clock signals and the reference clock signal.

In an embodiment, a semiconductor apparatus may is include: a first divider, a second divider, a plurality of clock generation circuits and a plurality of input/output terminals. The first divider may be configured to divide external clock signals to generate first divided multiphase clock signals. The second divider may be configured to output, as a reference clock signal, one of signals generated by dividing the first divided multiphase clock signals. The plurality of clock generation circuits may each be configured to generate second divided multiphase clock signals according to one, which corresponds to each of the plurality of clock generation circuits among the reference clock signal and shifted reference clock signals, and a portion of the first divided multiphase clock signals. The plurality of input/output terminals may each be configured to perform data transmission and reception according to the first divided multiphase clock signals and the second divided multiphase clock signals.

In an embodiment, a semiconductor apparatus may include: a plurality of input/output terminals, a global distribution circuit, and a local distribution circuit. The plurality of input/output terminals may each be configured to perform data transmission and reception according to first divided multiphase clock signals of at least 2-phase or more and second divided multiphase clock signals of at least 2-phase. The global distribution circuit may be configured to divide external clock signals to generate the first divided multiphase clock signals and divide any one of the first divided multiphase clock signals to generate a 1-phase reference clock signal. The local distribution circuit may be configured to generate the second divided multiphase clock signals according to a portion of the first divided multiphase clock signals and the reference clock signal.

In an embodiment, a clock distribution circuit may include a global distribution circuit, a first local distribution circuit and a second local distribution circuit. The global distribution circuit may be configured to receive external clock signals and configured to generate internal clock signals and primary reference clock signal set according to the external clock signals. The first local distribution circuit may be configured to receive the internal clock signals and the primary reference clock signal set and may be configured to generate a secondary reference clock signal set according to the internal clock signals and the primary reference clock signal set. The second local distribution circuit may be configured to receive the internal clock signals and the secondary reference clock signal set and may be configured to generate a thirdly reference clock signal set according to the internal clock signals and the secondary reference clock signal set.

In an embodiment, a semiconductor apparatus may include a transmission circuit, a global distribution circuit and a first local distribution circuit. The transmission circuit may be coupled to a data line and an input/output pad and may be configured to serialize data, which is provided through the data line, by multiplexing the data according to at least one of internal clock signals, first local multiphase clock signals and second local multiphase clock signals and may be configured to provide the serialized data to the input/output pad. The global distribution circuit may be configured to receive external clock signals and configured to generate internal clock signals and primary reference clock signal set according to the external clock signals. The first local distribution circuit may be configured to generate the first local multiphase clock signals according to the internal clock signals and the one signal of the primary reference clock signal set, may be configured to output one of the first local multiphase clock signals as one signal of the secondary reference clock signal set, may be configured to generate the second local multiphase clock signals according to a part of the first local multiphase clock signals and the other signal of the primary reference clock signal set and may be configured to output one of the second local multiphase clock signals as the other signal of the secondary reference clock signal set.

DETAILED DESCRIPTION

Hereinafter, embodiments of the present disclosure will be described in more detail with reference to the accompanying drawings.

Figure 1:
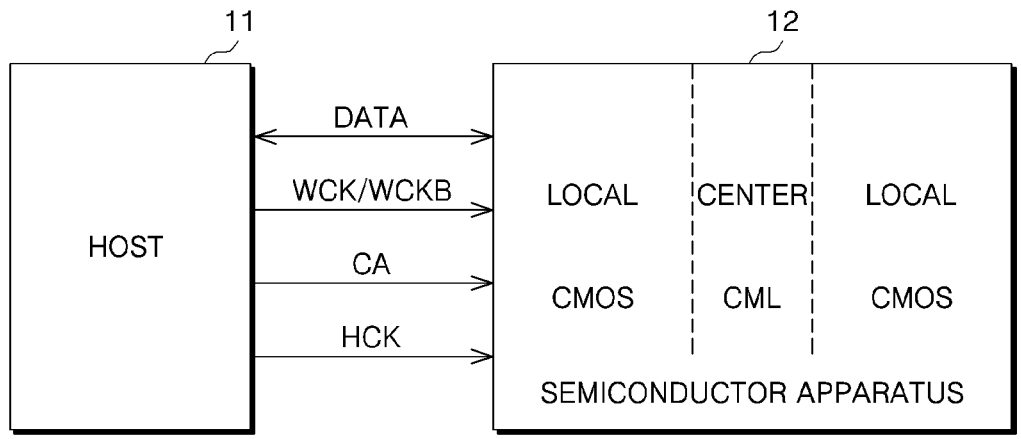
FIG. 1 is a block diagram illustrating a configuration of a data processing system in accordance with an embodiment of the present disclosure.

FIG. 1 is a block diagram illustrating a configuration of a data processing system 10 in accordance with an embodiment of the present disclosure.

Referring to FIG. 1, the data processing system 10 in accordance with the embodiment may include a host 11 and a semiconductor apparatus 12.

The host 11 may provide clock signals HCK and WCK/WCKB, and a command and address signal CA to the semiconductor apparatus 12, and exchange data DATA with the semiconductor apparatus 12.

Hereinafter, the clock signals HCK and WCK/WCKB will be referred to as external clock signals on the basis of the semiconductor apparatus 12.

The host 11 may be, for example, a memory controller such as a central processing unit (CPU) or a graphics processing unit (GPU).

A first external clock signal HCK is a clock signal related to the command and address signal CA, and may be used as a reference signal when the semiconductor apparatus 12 receives the command and address signal CA.

Second external clock signals WCK/WCKB are clock signals related to the data DATA, and in an embodiment, a differential clock signal is used as an example, and a signal phase clock signal may be used. The second external clock signals WCK/WCKB may be used as reference signals when the semiconductor apparatus 12 receives the data DATA.

Each of the second external clock signals WCK/WCKB may have a relatively higher frequency than the first external clock signal HCK.

Each of the second external clock signals WCK/WCKB may have a frequency of, for example, 8 GHz, whereas the first external clock signal HCK may have a frequency of, for example, 1 GHz, which is a relatively lower frequency than the second external clock signals WCK/WCKB.

The semiconductor apparatus 12 may be, for example, a memory apparatus.

Logic circuits included in the semiconductor apparatus 12 may be classified into current mode logic (CML) circuits and complementary metal-oxide semiconductor (CMOS) circuits according to a signal processing method thereof.

Regions of the semiconductor apparatus 12 may be divided into a first region where the CML circuits are disposed and a second region where the CMOS circuits are disposed.

For convenience of description, the regions of the semiconductor apparatus 12 may be divided into a center region (CENTER CML) and local regions (LOCAL CMOS), wherein the center region (CENTER CML) corresponds to the first region and the local regions (LOCAL CMOS) correspond to the second region.

Activation states of the circuits in the center region (CENTER CML) may be substantially maintained regardless of a read/write operation of the semiconductor apparatus.

Of course, a portion of the CML-level clock signals may be deactivated by an instruction such as power-down mode and refresh.

Circuits in the local regions (LOCAL CMOS) may be activated or deactivated according to the read/write operation of the semiconductor apparatus.

The CML circuits in the center region (CENTER CML) may transfer signals input thereto to other CML circuits that are relatively closer than the local region (LOCAL CMOS). On the other hand, the CMOS circuits in the local region (LOCAL CMOS) may receive signals, which are processed at the CML level in the center region (CENTER CML), through a global line having a relatively larger loading than an internal signal line in the center region (CENTER CML), and convert the signals into signals having the CMOS level.

Figure 2:
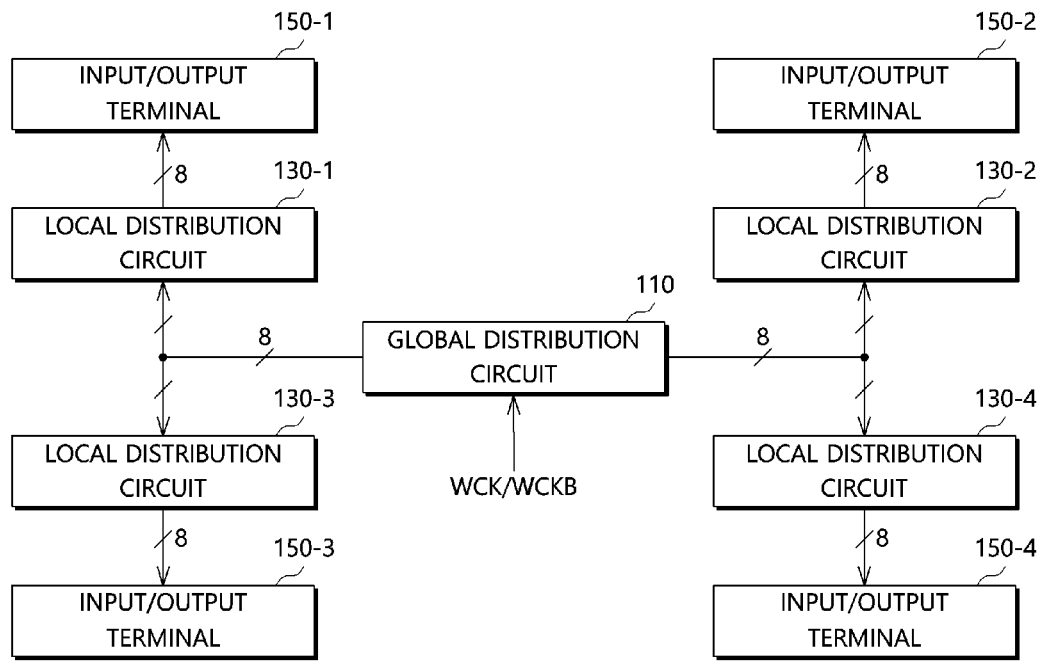
FIG. 2 is a block diagram illustrating a configuration of a semiconductor apparatus in accordance with an embodiment of the present disclosure.

FIG. 2 is a block diagram illustrating a configuration of a semiconductor apparatus 100 in accordance with an embodiment of the present disclosure.

Referring to FIG. 2, the semiconductor apparatus 100 in accordance with the embodiment may include a global distribution circuit 110, a plurality of local distribution circuits 130-1 to 130-4, and a plurality of input/output terminals 150-1 to 150-4.

The global distribution circuit 110 may divide the external clock signals WCK/WCKB to generate first divided multiphase clock signals and second divided multiphase clock signals. For example, the first divided multiphase clock signals may be 4-phase clock signals obtained by 2-dividing the external clock signals WCK/WCKB, and the second divided multiphase clock signals may be 4-phase clock signals obtained by 2-dividing the first divided multiphase clock signals.

The first divided multiphase clock signals and the second divided multiphase clock signals may each have the CML level.

The plurality of local distribution circuits 130-1 to 130-4 may have substantially the same configuration.

The local distribution circuit 130-1 may convert the first divided multiphase clock signals and the second divided multiphase clock signals into signals having the CMOS level and output the signals having the CMOS level.

The first divided multiphase clock signals and the second divided multiphase clock signals having the CMOS level, which are outputted from each of the plurality of local distribution circuits 130-1 to 130-4, may be provided to the plurality of input/output terminals 150-1 to 150-4, respectively.

The plurality of input/output terminals 150-1 to 150-4 may perform data transmission and reception according to the first divided multiphase clock signals and the second divided multiphase clock signals.

The plurality of input/output terminals 150-1 to 150-4 may have substantially the same configuration.

Each of the plurality of input/output terminals 150-1 to 150-4 may include a DQ pad, that is, an input/output pad, and a transmission/reception circuit (not shown in FIG. 2).

Figure 3:
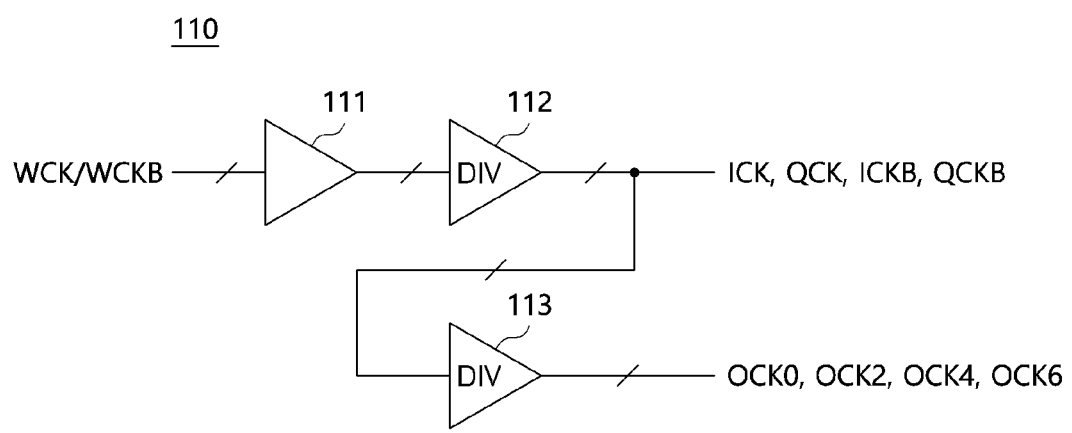
FIG. 3 is a diagram illustrating a configuration of a global distribution circuit of FIG. 2.

FIG. 3 is a diagram illustrating a configuration of the global distribution circuit 110 of FIG. 2.

Referring to FIG. 3, the global distribution circuit 110 may include a buffer 111, a first divider (DIV) 112, and a second divider (DIV) 113.

The first divider (DIV) 112 may divide the external clock signals WCK/WCKB received through the buffer 111 to generate the first divided multiphase clock signals ICK, QCK, ICKB, and QCKB.

For example, the first divided multiphase clock signals ICK, QCK, ICKB, and QCKB may be generated by 2-dividing the external clock signals WCK/WCKB. The first divided multiphase clock signals ICK, QCK, ICKB, and QCKB may have a frequency corresponding to ½ of that of the external clock signals WCK/WCKB.

The second divider (DIV) 113 may divide the first divided multiphase clock signals ICK, QCK, ICKB, and QCKB to generate the second divided multiphase clock signals OCK0, OCK2, OCK4, and OCK6.

For example, the second divided multiphase clock signals OCK0, OCK2, OCK4, and OCK6 may be generated by 2-dividing the first divided multiphase clock signals ICK, QCK, ICKB, and QCKB. The second divided multiphase clock signals OCK0, OCK2, OCK4, and OCK6 may have a frequency corresponding to ½ of that of the first divided multiphase clock signals ICK, QCK, ICKB, and QCKB and may have a frequency corresponding to ¼ of that of the external clock signals WCK/WCKB.

Figure 4:
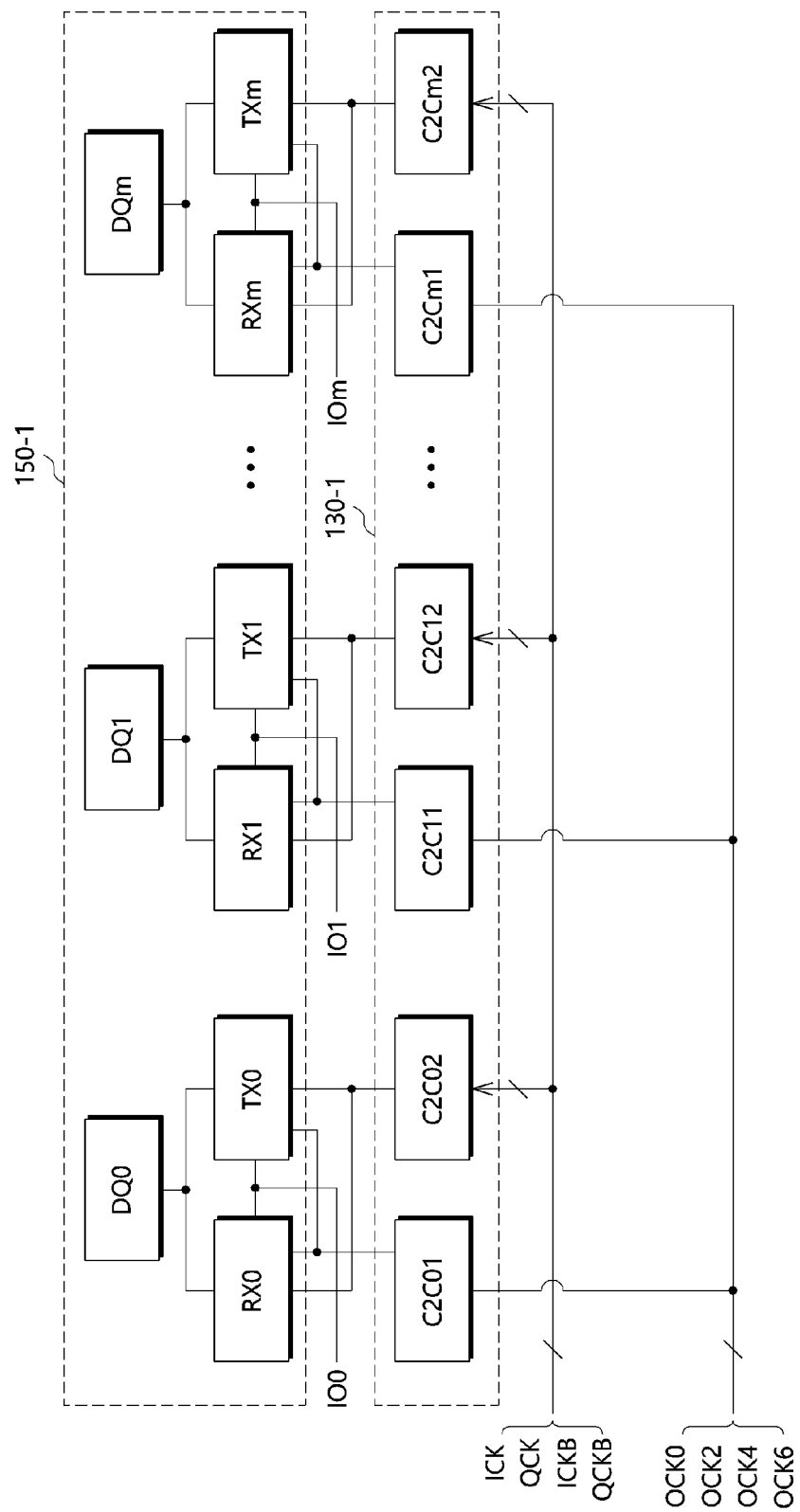
FIG. 4 is a block diagram illustrating a configuration of a local distribution circuit and an input/output terminal of FIG. 2.
Figure 5:
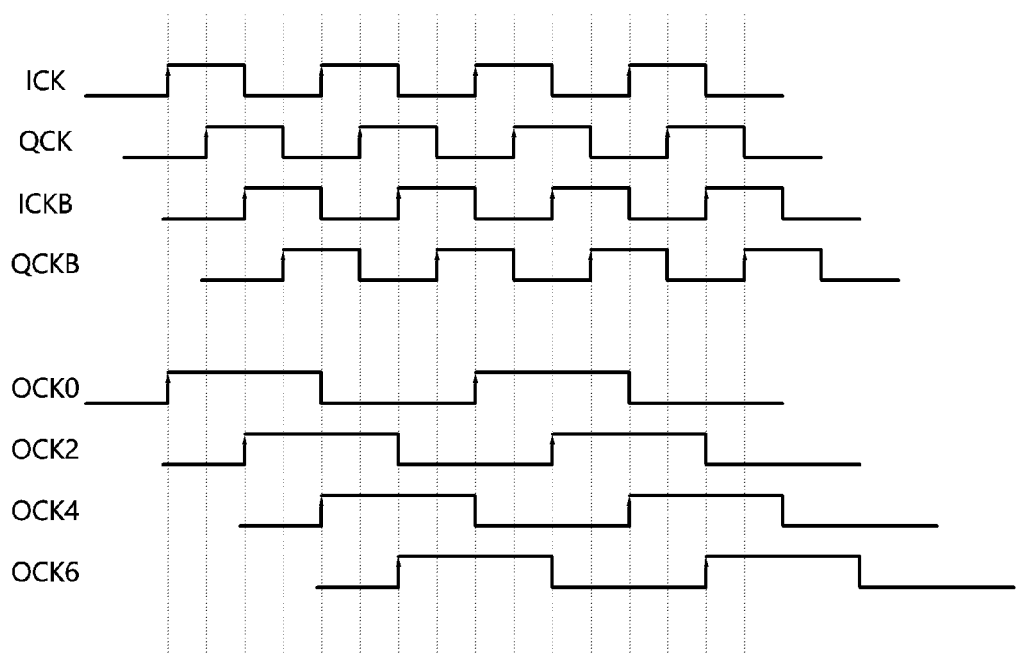
FIG. 5 is a diagram illustrating an output waveform of the local distribution circuit of FIG. 4.

FIG. 4 is a block diagram illustrating a configuration of is the local distribution circuit 130-1 and the input/output terminal 150-1 of FIG. 2, and FIG. 5 is a diagram illustrating an output waveform of the local distribution circuit 130-1 of FIG. 4.

Referring to FIG. 4, the local distribution circuit 130-1 may include a plurality of converters C2C01, C2C02, C2C11, C2C12, . . . , C2Cm1, C2Cm2.

Each of the plurality of converters C2C01, C2C02, C2C11, C2C12, . . . , C2Cm1, C2Cm2 may convert an input signal having the CML level into a signal having the CMOS level and output the signal having the CMOS level.

The plurality of converters C2C01, C2C02, C2C11, C2C12, . . . , C2Cm1, C2Cm2 may convert the first divided multiphase clock signals ICK, QCK, ICKB, and QCKB and the second divided multiphase clock signals OCK0, OCK2, OCK4, and OCK6, which are inputted at the CML level, into signals having the CMOS level and provide the signals having the CMOS level to the input/output terminal 150-1.

The input/output terminal 150-1 may include a plurality of receivers RX0 to RXm, a plurality of transmitters TX0 to TXm, and input/output pads DQ0 to DQm.

A pair of transmitter/receiver may be electrically connected to each of the input/output pads DQ0 to DQm, and one converter may be electrically connected to each of the transmitter and the receiver.

For example, the transmitter TX0 and the receiver RX0 may be electrically connected to the input/output pad DQ0, and the converter C2C01 may be electrically connected to the transmitter TX0. The converter C2C02 may be electrically connected to the receiver RX. A data line IO0 may be electrically connected to the transmitter TX0 and the receiver RX0.

The converter C2C01 may convert the second divided multiphase clock signals OCK0, OCK2, OCK4, and OCK6 inputted at the CML level into signals having the CMOS level as illustrated In FIG. 5, and may provide the signals having the CMOS level to the transmitter TX0 and the receiver RX0.

The converter C2C02 may convert the first divided multiphase clock signals ICK, QCK, ICKB, and QCKB inputted at the CML level into signals having the CMOS level as illustrated in FIG. 5, and may provide the signals having the CMOS level to the transmitter TX0 and the receiver RX0.

The transmitter TX0 may receive data, which is transmitted from a memory block (not illustrated) through the data line IO0, according to the first divided multiphase clock signals ICK, QCK, ICKB, and QCKB, and output the received data to the input/output pad DQ0 according to the second divided multiphase clock signals OCK0, OCK2, OCK4, and OCK6.

The receiver RX0 may receive data, which is inputted to the input/output pad DQ0, according to the first divided multiphase clock signals ICK, QCK, ICKB, and QCKB, and transmit the data to the memory block through the data line TOO according to the second divided multiphase clock signals OCK0, OCK2, OCK4, and OCK6.

Figure 6:
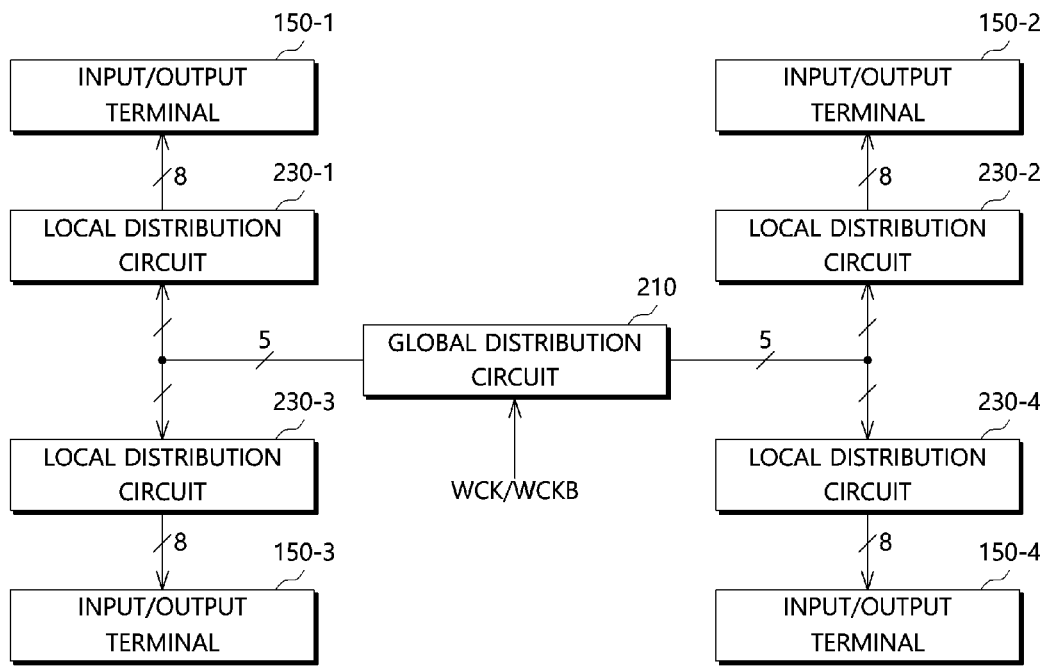
FIG. 6 is a block diagram illustrating a configuration of a semiconductor apparatus in accordance with another embodiment.

FIG. 6 is a block diagram illustrating a configuration of a semiconductor apparatus 200 in accordance with another embodiment of the present disclosure.

Referring to FIG. 6, the semiconductor apparatus 200 in accordance with the embodiment of FIG. 6 may include a global distribution circuit 210, a plurality of local distribution circuits 230-1 to 230-4, and a plurality of input/output terminals 150-1 to 150-4.

The global distribution circuit 210 may divide the external clock signals WCK/WCKB to generate first divided multiphase clock signals and divide any one of the first divided multiphase clock signals to generate a reference clock signal. For example, the first divided multiphase clock signals may be 4-phase clock signals obtained by 2-dividing the external clock signals WCK/WCKB, and the reference clock signal may be any one of the 4-phase clock signals obtained by 2-dividing the first divided multiphase clock signals.

Eight global signal lines may be electrically connected to the global distribution circuit 110, described with reference to FIG. 2, in order to transmit the 4-phase first divided multiphase clock signals and the 4-phase second divided multiphase clock signals to the plurality of local distribution circuits 130-1 to 130-4.

On the other hand, the global distribution circuit 210 of FIG. 6 transmits the 4-phase first divided multiphase clock signals and the 1-phase reference clock signal to the plurality of local distribution circuits 230-1 to 230-4. Therefore, five global signal lines smaller than eight global signal lines may be electrically connected to the global distribution circuit 210.

As the number of global signal lines for transmitting the clock signals is reduced, it is possible to reduce power consumption of the semiconductor apparatus, which is accomplished in the present disclosure.

The first divided multiphase clock signals may each have the CML level. The level of the reference clock signal may be converted into the CMOS level by the global distribution circuit 210 itself.

The plurality of local distribution circuits 230-1 to 230-4 may have substantially the same configuration.

The local distribution circuit 230-1 may convert the first divided multiphase clock signals into signals having the CMOS level and output the signals having the CMOS level, and generate the second divided multiphase clock signals according to the reference clock signal and a portion of the first divided multiphase clock signals.

The first divided multiphase clock signals and the second divided multiphase clock signals, which are outputted from each of the plurality of local distribution circuits 230-1 to 230-4, may be provided to each of the plurality of input/output terminals 150-1 to 150-4.

The plurality of input/output terminals 150-1 to 150-4 may perform data transmission and reception according to the first divided multiphase clock signals and the second divided multiphase clock signals.

The plurality of input/output terminals 150-1 to 150-4 may have substantially the same configuration.

Each of the plurality of input/output terminals 150-1 to 150-4 may include an input/output pad and a transmission/reception circuit.

Figure 7:
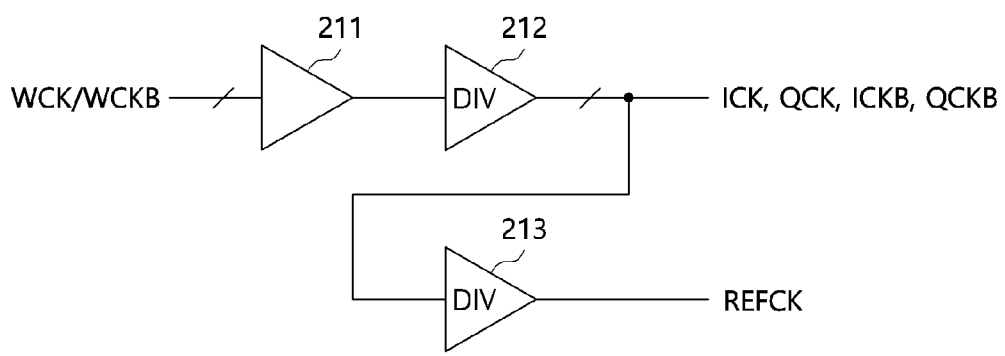
FIG. 7 is a diagram illustrating a configuration of a global distribution circuit of FIG. 6.

FIG. 7 is a diagram illustrating a configuration of the global distribution circuit 210 of FIG. 6.

Referring to FIG. 7, the global distribution circuit 210 may include a buffer 211, a first divider (DIV) 212, and a second divider (DIV) 213.

The first divider (DIV) 212 may divide the external clock signals WCK/WCKB received through the buffer 211 to generate the first divided multiphase clock signals ICK, QCK, ICKB, and QCKB.

For example, the first divided multiphase clock signals ICK, QCK, ICKB, and QCKB may be generated by 2-dividing the external clock signals WCK/WCKB. The first divided multiphase clock signals ICK, QCK, ICKB, and QCKB may have a frequency corresponding to ½ of that of the external clock signals WCK/WCKB.

The second divider (DIV) 213 may output, as a reference clock signal REFCK, one of signals generated by dividing the first divided multiphase clock signals ICK, QCK, ICKB, and QCKB.

The second divider (DIV) 213 may also be configured to generate the reference clock signal REFCK by dividing one (for example, ICK) of the first divided multiphase clock signals ICK, QCK, ICKB, and QCKB.

The second divider (DIV) 213 may convert the reference clock signal REFCK into a signal having the CMOS level and output the signal having the CMOS level.

The reference clock signal REFCK may have a frequency corresponding to ½ of that of the first divided multiphase clock signals ICK, QCK, ICKB, and QCKB and have a frequency corresponding to ¼ of that of the external clock signals WCK/WCKB.

Figure 8:
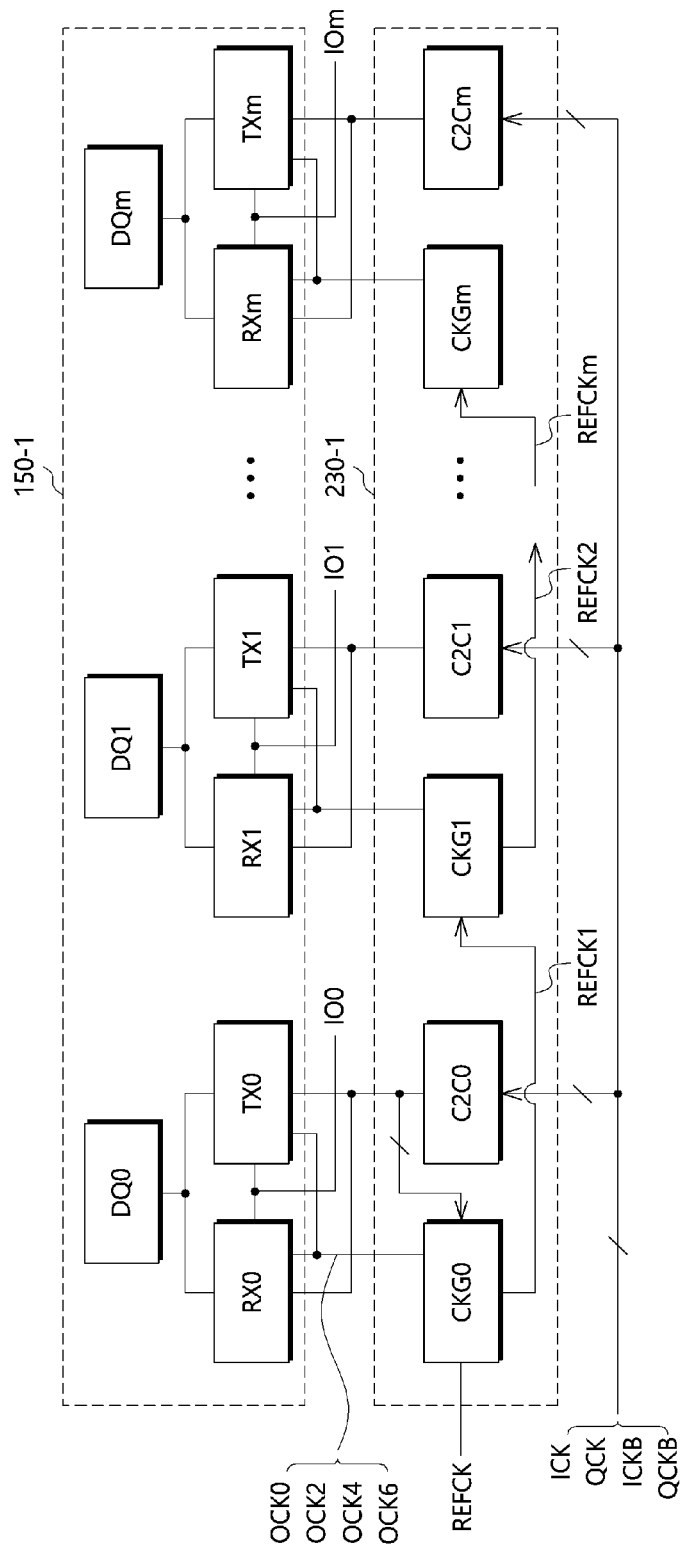
FIG. 8 is a block diagram illustrating a configuration of a local distribution circuit and an input/output terminal of FIG. 6.
Figure 9:
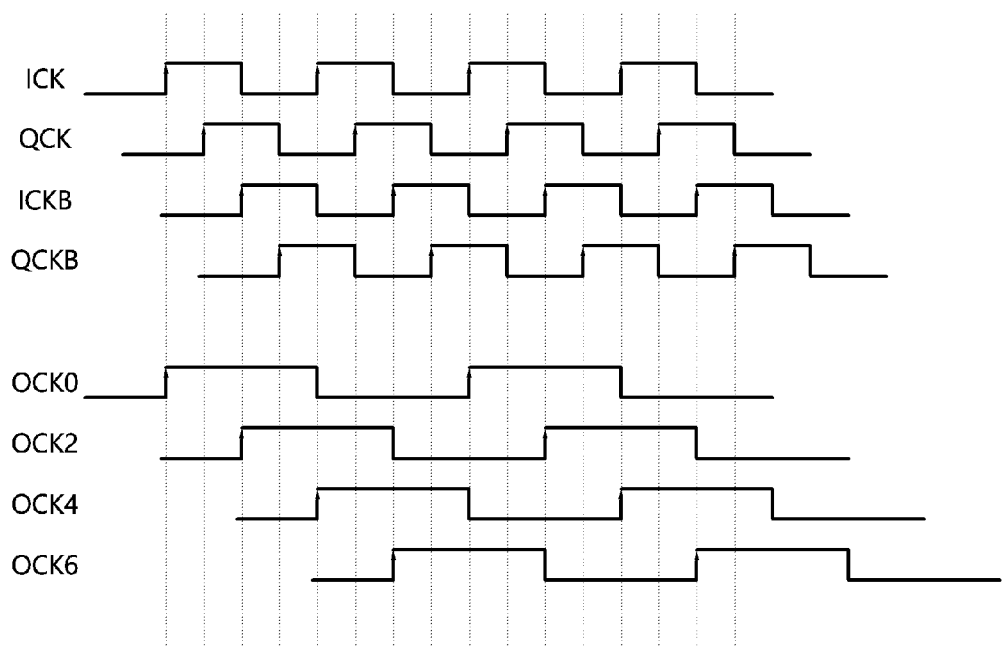
FIG. 9 is a diagram illustrating an output waveform of the local distribution circuit of FIG. 8.

FIG. 8 is a block diagram illustrating a configuration of the local distribution circuit 230-1 and the input/output terminal 150-1 of FIG. 6. FIG. 9 is a diagram illustrating an output waveform of the local distribution circuit 230-1 of FIG. 6.

Referring to FIG. 8, the local distribution circuit 230-1 may include a plurality of converters C2C0, C2C1, . . . , C2Cm and a plurality of clock generation circuits CKG0 to CKGm.

Each of the plurality of converters C2C0, C2C1, . . . , C2Cm may convert an input signal having the CML level into a signal having the CMOS level and output the signal having the CMOS level.

The plurality of converters C2C0, C2C1, . . . , C2Cm may convert the first divided multiphase clock signals ICK, QCK, ICKB, and QCKB inputted at the CML level into signals having the CMOS level and provide the converted signals to the input/output terminal 150-1.

The converter C2C0 may convert the first divided multiphase clock signals ICK, QCK, ICKB, and QCKB inputted at the CML level into signals having the CMOS level as illustrated in FIG. 9, and provide the signals having the CMOS level to a transmitter TX0 and a receiver RX0.

The converter C2C1 may convert the first divided multiphase clock signals ICK, QCK, ICKB, and QCKB inputted at the CML level into signals having the CMOS level as illustrated in FIG. 9, and provide the signals having the CMOS level to a transmitter TX1 and a receiver RX1.

The converter C2Cm may convert the first divided multiphase clock signals ICK, QCK, ICKB, and QCKB inputted at the CML level into signals having the CMOS level as illustrated in FIG. 9, and provide the signals having the CMOS level to a transmitter TXm and a receiver RXm.

The plurality of clock generation circuits CKG0 to CKGm may have substantially the same configuration.

Each of the plurality of clock generation circuits CKG0 to CKGm may generate the second divided multiphase clock signals OCK, OCK2, OCK4, and OCK6 according to one, which corresponds to each of the plurality of clock generation circuits CKG0 to CKGm among the reference clock signal REFCK and shifted reference clock signals REFCK1, REFCK2, . . . , REFCKm, and a portion (for example, ICK and ICKB) of the first divided multiphase clock signals ICK, QCK, ICKB, and QCKB.

Each of the plurality of clock generation circuits CKG0 to CKGm may generate another one corresponding to the next order according to one corresponding to each of the plurality of clock generation circuits CKG0 to CKGm among the reference clock signal REFCK and the shifted reference clock signals REFCK1, REFCK2, . . . , REFCKm.

The clock generation circuit CKG0 may generate the second divided multiphase clock signals OCK0, OCK2, OCK4, and OCK6 and the shifted reference clock signal REFCK1 according to the reference clock signal REFCK and the first divided multiphase clock signals ICK and ICKB.

The clock generation circuit CKG1 may generate the second divided multiphase clock signals OCK0, OCK2, OCK4, and OCK6 and the shifted reference clock signal REFCK2 according to the shifted reference clock signal REFCK1 and the first divided multiphase clock signals ICK and ICKB.

The clock generation circuit CKGm may generate the second divided multiphase clock signals OCK0, OCK2, OCK4, and OCK6 according to the shifted reference clock signal REFCKm outputted from the clock generation circuit CKGm-1 (not illustrated) of a previous stage and the first divided multiphase clock signals ICK and ICKB.

The input/output terminal 150-1 may include the plurality of receivers RX0 to RXm, the plurality of transmitters TX0 to TXm, and input/output pads DQ0 to DQm.

A pair of transmitter/receiver may be electrically connected to each of the input/output pads DQ0 to DQm, and one converter may be electrically connected to both the transmitter and the receiver.

For example, the transmitter TX0 and the receiver RX0 may be electrically connected to the input/output pad DQ0, and the converter C2C0 may be electrically connected to both the transmitter TX0 and the receiver RX0. A data line IO0 may be electrically connected to the transmitter TX0 and the receiver RX0.

The transmitter TX0 may receive data, which is transmitted from a memory block (not illustrated) through the data line IO0, according to the first divided multiphase clock signals ICK, QCK, ICKB, and QCKB, and output the received data to the input/output pad DQ0 according to the second divided multiphase clock signals OCK0, OCK2, OCK4, and OCK6.

The receiver RX0 may receive data, which is inputted to the input/output pad DQ0, according to the first divided multiphase clock signals ICK, QCK, ICKB, and QCKB, and transmit the data to the memory block through the data line IO0 according to the second divided multiphase clock signals OCK0, OCK2, OCK4, and OCK6.

Figure 10:
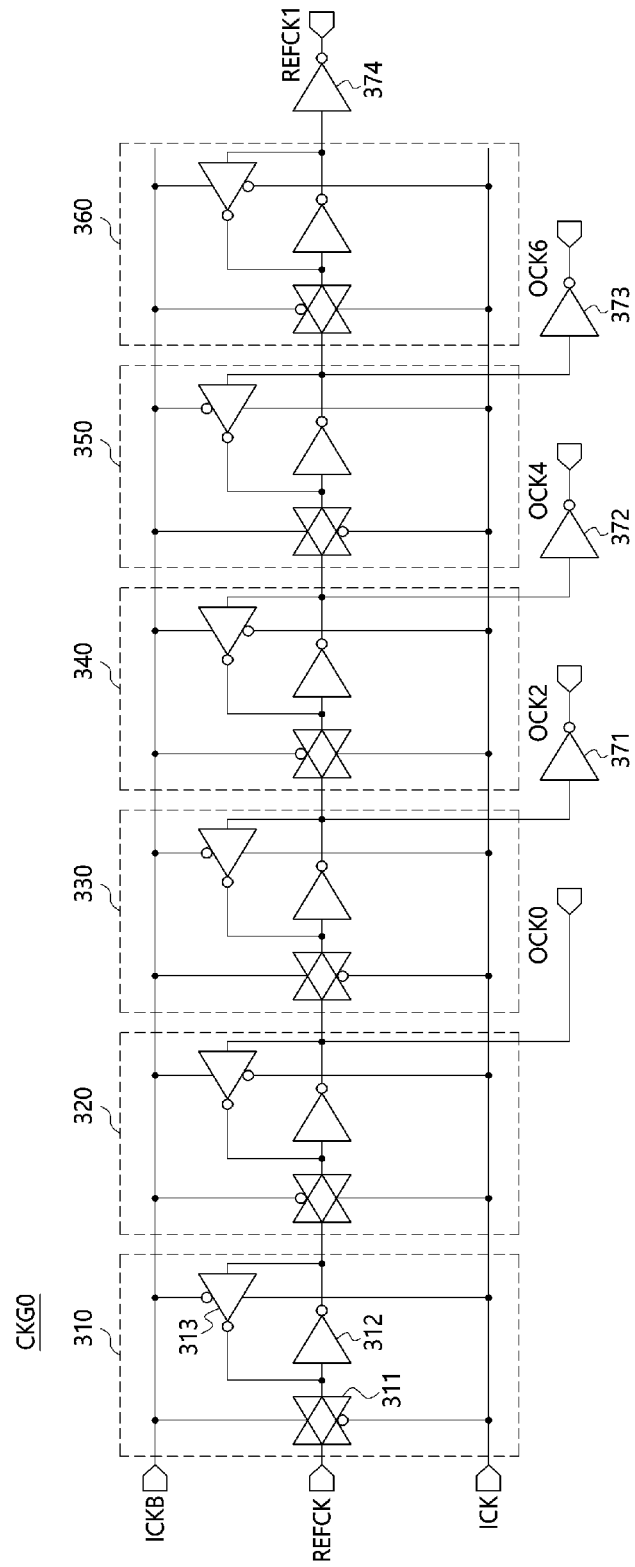
FIG. 10 is a diagram illustrating a configuration of a clock generation circuit of FIG. 8.
Figure 11:
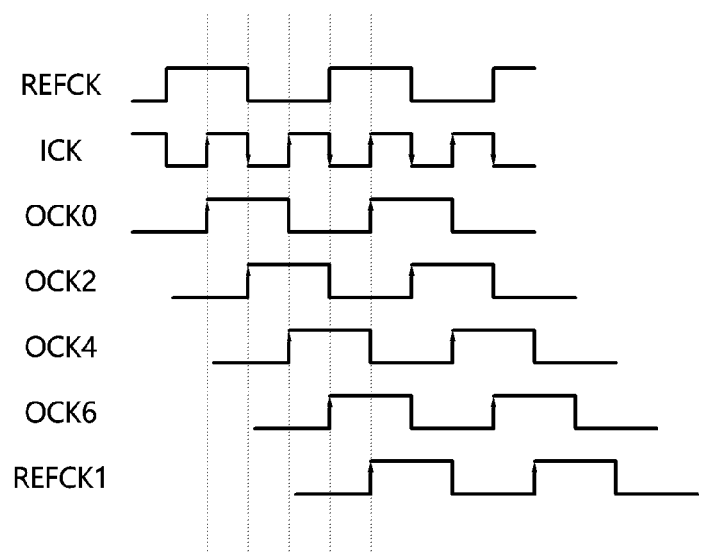
FIG. 11 is a diagram illustrating an output waveform of the clock generation circuit of FIG. 10.

FIG. 10 is a diagram illustrating a configuration of the clock generation circuit CKG0 of FIG. 8, and FIG. 11 is a diagram illustrating an output waveform of the clock generation circuit CKG0 of FIG. 10.

Referring to FIG. 10, the clock generation circuit CKG0 may shift the reference clock signal REFCK according to the first divided multiphase clock signals ICK and ICKB to generate the second divided multiphase clock signals OCK0, OCK2, OCK4, and OCK6 and the shifted reference clock signal REFCK1.

The clock generation circuit CKG0 may include a plurality of flip-flops 310, 320, 330, 340, 350, and 360 and a plurality of inverters 371 to 374.

A first flip-flop 310 may allow the reference clock signal REFCK to pass therethrough according to a falling edge of ICK and a rising edge of ICKB.

A second flip-flop 320 may allow an output signal of the first flip-flop 310 to pass therethrough according to a rising edge of ICK and a falling edge of ICKB.

An output signal of the second flip-flop 320 may be output as OCK0 among the second divided multiphase clock signals OCK0, OCK2, OCK4, and OCK6.

A third flip-flop 330 may allow the output signal of the second flip-flop 320, that is, OCK0, to pass therethrough according to the falling edge of ICK and the rising edge of ICKB.

An output signal of the third flip-flop 330 may be output as OCK2 among the second divided multiphase clock signals OCK0, OCK2, OCK4, and OCK6 via the inverter 371.

, A fourth flip-flop 340 may allow the output signal of the third flip-flop 330, that is, OCK2, to pass therethrough according to the rising edge of ICK and the falling edge of ICKB.

An output signal of the fourth flip-flop 340 may be output as OCK4 among the second divided multiphase clock signals OCK0, OCK2, OCK4, and OCK6 via the inverter 372.

A fifth flip-flop 350 may allow the output signal of the fourth flip-flop 340, that is, OCK4, to pass therethrough according to the falling edge of ICK and the rising edge of ICKB.

An output signal of the fifth flip-flop 350 may be output is as OCK6 among the second divided multiphase clock signals OCK0, OCK2, OCK4, and OCK6 via the inverter 373.

A sixth flip-flop 360 may allow the output signal of the fifth flip-flop 350, that is, OCK6, to pass therethrough according to the rising edge of ICK and the falling edge of ICKB.

An output signal of the sixth flip-flop 360 may be output as the shifted reference clock signal REFCK1 via the inverter 374.

The shifted reference clock signal REFCK1 may be provided to the clock generation circuit CKG1 adjacent to the clock generation circuit CKG0.

The plurality of flip-flops 310, 320, 330, 340, 350, and 360 may have substantially the same configuration.

For example, the first flip-flop 310 may include a pass gate 311 and latches 312 and 313.

The pass gate 311 may receive the reference clock signal REFCK according to the falling edge of ICK and the rising edge of ICKB.

The latches 312 and 313 may latch an output signal of the pass gate 311 according to the rising edge of ICK and the falling edge of ICKB.

As illustrated in FIG. 11, the clock generation circuit CKG0 may align the second divided multiphase clock signals OCK0, OCK2, OCK4, and OCK6 at an interval of 1 unit interval (UI) on the basis of ICK.

The clock generation circuit CKG0 samples the reference clock signal REFCK, which is obtained by 4-dividing the external clock signals WCK/WCKB, on the basis of ICK obtained by 2-dividing the external clock signals WCK/WCKB, so that it is possible to stably secure a timing margin for generating the second divided multiphase clock signals OCK0, OCK2, OCK4, and OCK6.

The timing margin is stably secured in the process of generating the second divided multiphase clock signals OCK0, OCK2, OCK4, and OCK6, so that it is possible to reduce a skew in the clock signal distribution process.

Figure 12:
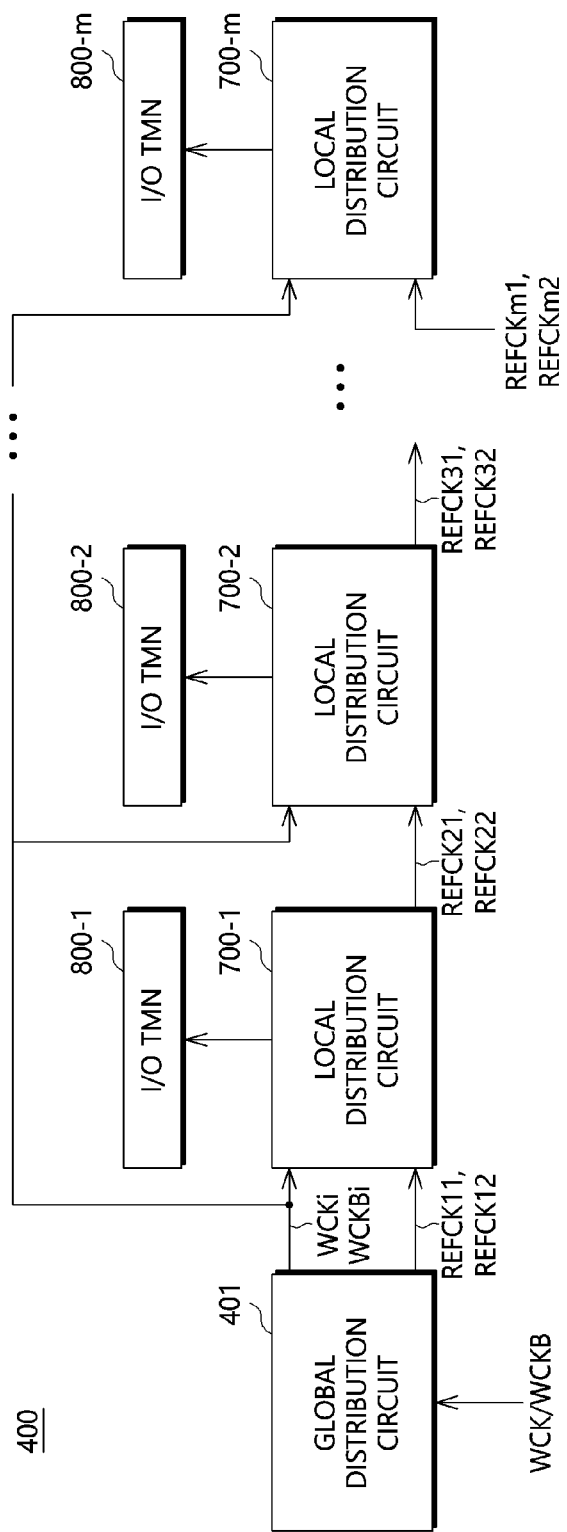
FIG. 12 is a block diagram illustrating a configuration of a semiconductor apparatus in accordance with another embodiment of the present disclosure.

FIG. 12 is a block diagram illustrating a configuration of a semiconductor apparatus 400 in accordance with another embodiment of the present disclosure.

Referring to FIG. 12, the semiconductor apparatus 400 according to another embodiment of the present disclosure may include a global distribution circuit 401, a plurality of local distribution circuits 700-1 to 700-$m$ and a plurality of input/output terminals (I/O TMN) 800-1 to 800-$m$.

The global distribution circuit 401 may receive external clock signals WCK/WCKB to output internal clock signals WCKi/WCKBi and a primary reference clock signal set REFCK11 and REFCK12. The global distribution circuit 401 may buffer the external clock signals WCK/WCKB to generate the internal clock signals WCKi/WCKBi. While buffering the external clock signals WCK/WCKB, the global distribution circuit 401 may perform at least one of the duty correction and the load correction to generate the internal clock signals WCKi/WCKBi. The global distribution circuit 401 may divide the external clock signals WCK/WCKB to generate first global multiphase clock signals and may generate, according to the first global multiphase clock signals, one signal of the primary reference clock signal set REFCK11 and REFCK12, e.g., the primary reference clock signal REFCK11. The global distribution circuit 401 may divide the first global multiphase clock signals to generate second global multiphase clock signals and may generate, according to the second global multiphase clock signals, the other signal of the primary reference clock signal set REFCK11 and REFCK12, e.g., the primary reference clock signal REFCK12. For example, each of the first global multiphase clock signals may be a 4-phase clock signal obtained by 2-dividing the external clock signals WCK/

WCKB, each of the second global multiphase clock signals may be a 4-phase clock signal obtained by 2-dividing the first global multiphase clock signals, each of the internal clock signals WCKi/WCKBi may be a 2-phase clock signal and each signal of the primary reference clock signal set REFCK11 and REFCK12 may be a 1-phase clock signal.

Among the plurality of local distribution circuits 700-1 to 700-m, the first local distribution circuit 700-1 may receive the internal clock signals WCKi/WCKBi and the primary reference clock signal set REFCK11 and REFCK12 to output a secondary reference clock signal set REFCK21 and REFCK22. According to the internal clock signals WCKi/WCKBi and one signal of the primary reference clock signal set REFCK11 and REFCK12, e.g., the primary reference clock signal REFCK11, the first local distribution circuit 700-1 may generate first local multiphase clock signals and may output one of the first local multiphase clock signals as one signal of the secondary reference clock signal set REFCK21 and REFCK22, e.g., the secondary reference clock signal REFCK21. According to a part of the first local multiphase clock signals and the other signal of the primary reference clock signal set REFCK11 and REFCK12, e.g., the primary reference clock signal REFCK12, the first local distribution circuit 700-1 may generate second local multiphase clock signals and may output one of the second local multiphase clock signals as the other signal of the secondary reference clock signal set REFCK21 and REFCK22, e.g., the secondary reference clock signal REFCK22.

Each of the remaining local distribution circuits 700-2 to 700-m may have the same configuration and perform the same operation as the first local distribution circuit 700-1 except for the input signal. For example, the second local distribution circuit 700-2 may receive the internal clock signals WCKi/WCKBi and the secondary reference clock signal set REFCK21 and REFCK22 to output a thirdly reference clock signal set REFCK31 and REFCK32.

The global distribution circuit 110 described with reference to FIG. 2 may be coupled to eight (8) number of global signal lines configured to transfer, to the plurality of local distribution circuits 130-1 to 130-4, the first divided multiphase clock signals of a 4-phase and the second divided multiphase clock signals of a 4-phase. On the other hand, the global distribution circuit 401 of FIG. 12 may provide the plurality of local distribution circuits 700-1 to 700-m with the internal clock signals WCKi/WCKBi of a 2-phase and may provide one of the plurality of local distribution circuits 700-1 to 700-m with the primary reference clock signal set REFCK11 and REFCK12 including signals each of a 1-phase. Therefore, the global distribution circuit 401 may be coupled to the smaller number of global signal lines than the global distribution circuit 110. As the number of global signal lines becomes smaller to transfer clock signals, the power consumption of the semiconductor apparatus may become reduced.

The clock signals generated from the plurality of local distribution circuits 700-1 to 700-m may be provided to the plurality of input/output terminals 800-1 to 800-m, respectively. Therefore, the plurality of input/output terminals 800-1 to 800-m may transmit and receive data. The plurality of input/output terminals 800-1 to 800-m may be configured in the same way as each other.

Figure 13:
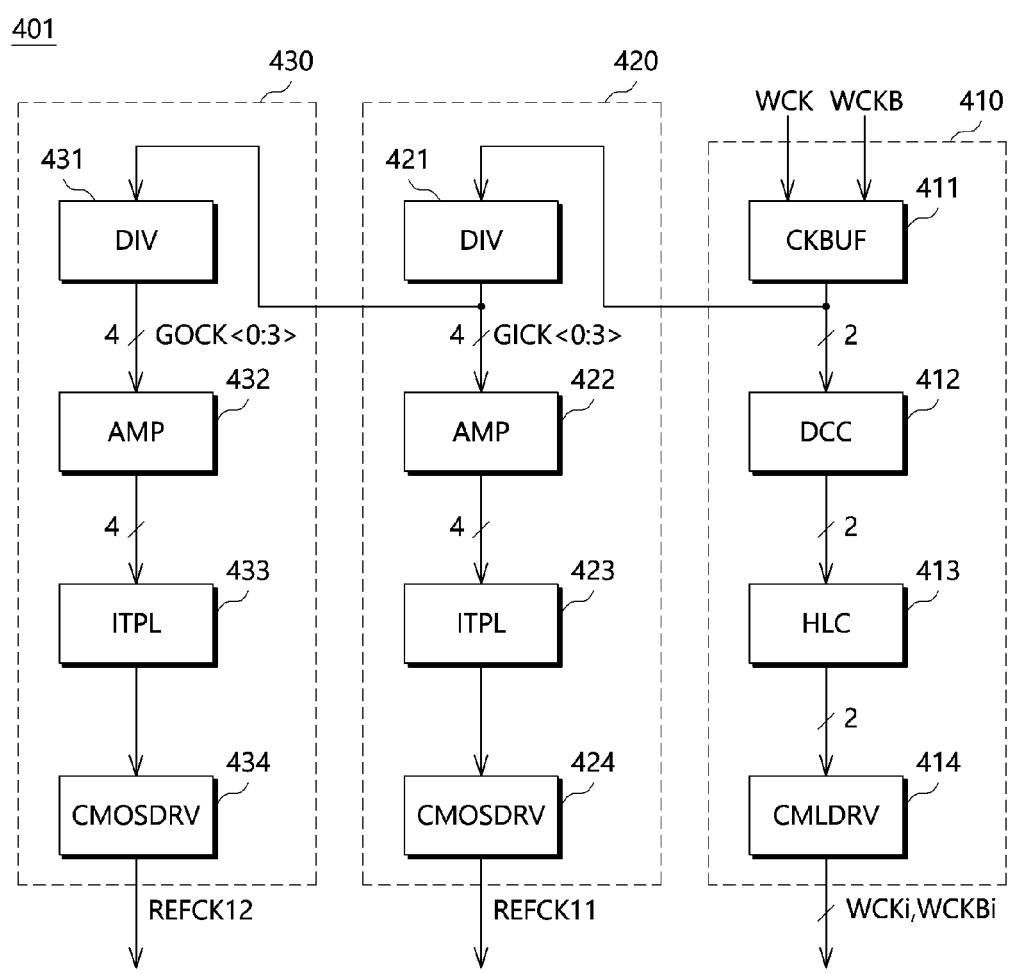
FIG. 13 is a diagram illustrating a configuration of a global distribution circuit of FIG. 12.

FIG. 13 is a diagram illustrating a configuration of a global distribution circuit 401 of FIG. 12.

Referring to FIG. 13, the global distribution circuit 401 may include an internal clock generation circuit 410, a primary reference clock generation circuit 420 and a secondary reference clock generation circuit 430.

The internal clock generation circuit 410 may receive the external clock signals WCK/WCKB to output the internal clock signals WCKi/WCKBi. The internal clock generation circuit 410 may receive the external clock signals WCK/WCKB. The internal clock generation circuit 410 may perform at least one of the duty correction and the load correction on the external clock signals WCK/WCKB to generate the internal clock signals WCKi/WCKBi. The external clock signals WCK/WCKB may have the CML level.

The internal clock generation circuit 410 may include a clock buffer (CKBUF) 411, a first compensation circuit (DCC) 412, a second compensation circuit (HLC) 413 and a driver (CMLDRV) 414. The clock buffer 411 may receive the external clock signals WCK/WCKB. The first compensation circuit 412 may selectively perform, according to an external control, at least one of the duty ratio correction operation and the high-frequency amplification operation on the external clock signals WCK/WCKB buffered in the clock buffer 411. The second compensation circuit 413 may perform the bandwidth and high-frequency gain correction operation on the output signals from the first compensation circuit 412. The second compensation circuit 413 may be activated according to an external control. The bandwidth and high-frequency gain of the external clock signals WCK/WCKB may be reduced due to the high-load component of the transmission line transferring the external clock signals WCK/WCKB having the CML level. The second compensation circuit 413 may compensate for the reduction of the bandwidth and high-frequency gain of the external clock signals WCK/WCKB. The driver 414 may drive the output signals from the second compensation circuit 413 to output the internal clock signals WCKi/WCKBi. Although FIG. 13 exemplifies the global distribution circuit 401 including the first compensation circuit 412 and the second compensation circuit 413, the global distribution circuit 401 may be configured only by the clock buffer 411 and the driver 414.

The primary reference clock generation circuit 420 may divide the external clock signals WCK/WCKB, which are the output signals from the clock buffer 411, to generate first global multiphase clock signals GICK<0:3>. The primary reference clock generation circuit 420 may generate, according to the first global multiphase clock signals GICK<0:3>, one signal of the primary reference clock signal set REFCK11 and REFCK12, e.g., the primary reference clock signal REFCK11. The primary reference clock generation circuit 420 may include a division circuit (DIV) 421, an amplification circuit (AMP) 422, a phase interpolation circuit (ITPL) 423 and a driver (CMOSDRV) 424.

The division circuit 421 may 2-divide and phase-separate the external clock signals WCK/WCKB to generate the first global multiphase clock signals GICK<0:3> of a 4-phase. The amplification circuit 422 may amplify the first global multiphase clock signals GICK<0:3> to the CMOS level. The phase interpolation circuit 423 may perform a phase interpolation operation on the output signals from the amplification circuit 422 to output one of the phase-interpolated signals. The driver 424 may drive the output from the phase interpolation circuit 423 to output the driven signal as one signal of the primary reference clock signal set REFCK11 and REFCK12, e.g., the primary reference clock signal REFCK11.

The secondary reference clock generation circuit 430 may divide the first global multiphase clock signals GICK<0:3> to generate second global multiphase clock signals GOCK<0:3>. The secondary reference clock generation circuit 430 may generate, according to the second global multiphase clock signals GOCK<0:3>, the other signal of the primary reference clock signal set REFCK11 and REFCK12, e.g., the primary reference clock signal REFCK12. The secondary reference clock generation circuit 430 may include a division circuit (DIV) 431, an amplification circuit (AMP) 432, a phase interpolation circuit (ITPL) 433 and a driver (CMOSDRV) 434.

The division circuit 431 may 2-divide the first global multiphase clock signals GICK<0:3> to generate the second global multiphase clock signals GOCK<0:3>. The amplification circuit 432 may amplify the second global multiphase clock signals GOCK<0:3> to the CMOS level. The phase interpolation circuit 433 may perform a phase interpolation operation on the output signals from the amplification circuit 432 to output one of the phase-interpolated signals. The driver 434 may drive the output from the phase interpolation circuit 433 to output the driven signal as the other signal of the primary reference clock signal set REFCK11 and REFCK12, e.g., the primary reference clock signal REFCK12.

Figure 14:
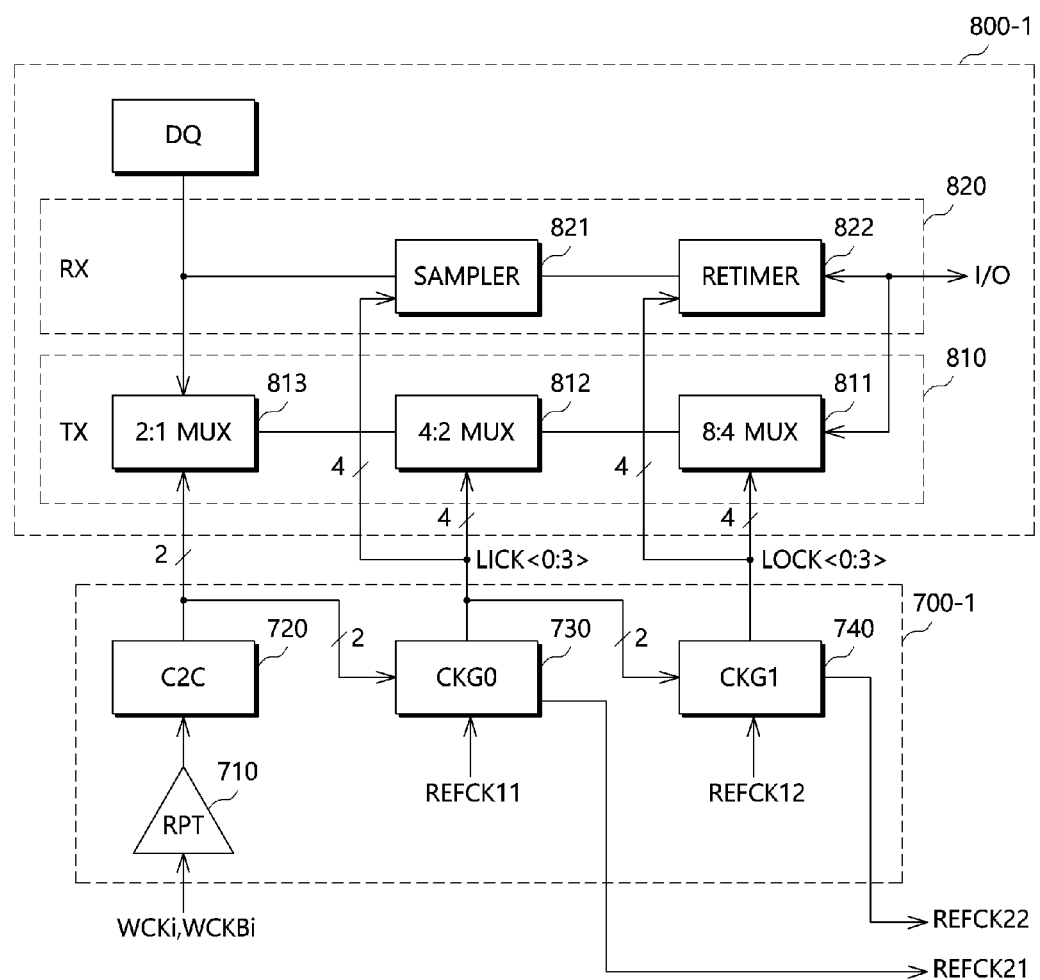
FIG. 14 is a block diagram illustrating a configuration of a local distribution circuit and an input/output terminal of FIG. 12.

FIG. 14 is a block diagram illustrating a configuration of the first local distribution circuit 700-1 and the input/output terminal 800-1 of FIG. 12.

Referring to FIG. 14, the first local distribution circuit 700-1 may include a repeater (RPT) 710, a converter (C2C) 720, a first clock generation circuit (CKG0) 730 and a second clock generation circuit (CKG1) 740. The repeater 710 may compensate for the lowered level of the internal clock signals WCKi/WCKBi from the global distribution circuit 401. The converter 720 may convert the internal clock signals WCKi/WCKBi, which are from the repeater 710, from the CML level to the CMOS level. The first clock generation circuit 730 may sample, according to the internal clock signals WCKi/WCKBi converted to the CMOS level, one signal of the primary reference clock signal set REFCK11 and REFCK12, e.g., the primary reference clock signal REFCK11 to generate first local multiphase clock signals LICK<0:3>. The first clock generation circuit 730 may output one of the first local multiphase clock signals LICK<0:3> as one signal of the secondary reference clock signal set REFCK21 and REFCK22, e.g., the secondary reference clock signal REFCK21. The first clock generation circuit 730 may be configured in the similar manner to the clock generation circuit CKG0 of FIG. 10. The second clock generation circuit 740 may sample, according to a part (e.g., two (2) number of signals) of the first local multiphase clock signals LICK<0:3>, the other signal of the primary reference clock signal set REFCK11 and REFCK12, e.g., the primary reference clock signal REFCK12 to generate second local multiphase clock signals LOCK<0:3>. The second clock generation circuit 740 may output one of the second local multiphase clock signals LOCK<0:3> as the other signal of the secondary reference clock signal set REFCK21 and REFCK22, e.g., the secondary reference clock signal REFCK22.

Referring to FIG. 14, the input/output terminal 800-1 may include a transmission circuit (TX) 810 and a reception circuit (RX) 820 and an input/output pad DQ. Each of the transmission circuit 810 and the reception circuit 820 may be coupled to the data line I/O and the input/output pad DQ. The transmission circuit 810 may include a first multiplexing circuit (8:4 MUX) 811, a second multiplexing circuit (4:2 MUX) 812 and a third multiplexing circuit (2:1 MUX) 813. The first multiplexing circuit 811 may perform, according to the second local multiphase clock signals LOCK<0:3>, an 8:4 multiplexing operation on data provided from a memory block through the data line I/O. The second multiplexing circuit 812 may perform, according to the first local multiphase clock signals LICK<0:3>, a 4:2 multiplexing operation on the data from the first multiplexing circuit 811. The third multiplexing circuit 813 may perform, according to the internal clock signals WCKi/WCKBi, a 2:1 multiplexing operation on the data from the second multiplexing circuit 812 to output the multiplexed data to the outside of the semiconductor apparatus 400 through the input/output pad DQ. The reception circuit 820 may include a sampler 821 and a re-timer 822. The sampler 821 may sample, according to the first local multiphase clock signals LICK<0:3>, data provided through the input/output pad DQ. The re-timer 822 may adjust, according to the second local multiphase clock signals LOCK<0:3>, the timing of the data from the sampler 821 to provide the adjusted data to the memory block through the data line I/O.

As described above, a person skilled in the art to which the present disclosure pertains can understand that the present disclosure may be carried out in other specific forms without changing its technical spirit or essential features. Therefore, it should be understood that the embodiments described above are illustrative in all respects, not limitative. The scope of the present disclosure is defined by the claims to be described below rather than the detailed description, and it should be construed that the meaning and scope of the claims and all changes or modified forms derived from the equivalent concept thereof are included in the scope of the present disclosure.

What is claimed is:

1. A clock distribution circuit comprising:
   a global distribution circuit configured to receive external clock signals and configured to generate internal clock signals and primary reference clock signal set according to the external clock signals;
   a first local distribution circuit configured to receive the internal clock signals and the primary reference clock signal set and configured to generate a secondary reference clock signal set according to the internal clock signals and the primary reference clock signal set; and
   a second local distribution circuit configured to receive the internal clock signals and the secondary reference clock signal set and configured to generate a thirdly reference clock signal set according to the internal clock signals and the secondary reference clock signal set.

2. The clock distribution circuit of claim 1, wherein the global distribution circuit includes:
   an internal clock generation circuit configured to buffer the external clock signals to generate the internal clock signals;
   a primary reference clock generation circuit configured to divide the external clock signals to generate the first global multiphase clock signals and configured to generate the one signal of the primary reference clock signal set according to the first global multiphase clock signals; and
   a secondary reference clock generation circuit configured to divide the first global multiphase clock signals to generate the second global multiphase clock signals and configured to generate the other signal of the primary reference clock signal set according to the second global multiphase clock signals.

3. The clock distribution circuit of claim 2, wherein the internal clock generation circuit includes:
   a clock buffer configured to receive the external clock signals; and a driver configured to drive output signals from the clock buffer to output the driven signals as the internal clock signals.

4. The clock distribution circuit of claim 3, wherein the internal clock generation circuit further includes:
   a first compensation circuit configured to selectively perform, according to an external control, at least one of a duty ratio correction operation and a high-frequency amplification operation on the external clock signals from the clock buffer; and
   a second compensation circuit configured to perform a bandwidth and high-frequency gain correction operation on output signals from the first compensation circuit.

5. The clock distribution circuit of claim 2, wherein the primary reference clock generation circuit includes:
   a division circuit configured to divide and phase-separate the external clock signals to generate the first global multiphase clock signals;
   an amplification circuit configured to amplify the first global multiphase clock signals to a complementary metal-oxide semiconductor (CMOS) level;
   a phase interpolation circuit configured to perform a phase interpolation operation on output signals from the amplification circuit to output one of the phase-interpolated signals; and
   a driver configured to drive an output from the phase interpolation circuit to output the driven signal as the one signal of the primary reference clock signal set.

6. The clock distribution circuit of claim 2, wherein the secondary reference clock generation circuit includes:
   is a division circuit configured to divide the first global multiphase clock signals to generate the second global multiphase clock signals;
   an amplification circuit configured to amplify the second global multiphase clock signals to a CMOS level;
   a phase interpolation circuit configured to perform a phase interpolation operation on output signals from the amplification circuit to output one of the phase-interpolated signals; and
   a driver configured to drive an output from the phase interpolation circuit to output the driven signal as the other signal of the primary reference clock signal set.

7. The clock distribution circuit of claim 1, wherein the first local distribution circuit is configured to generate first local multiphase clock signals according to the internal clock signals and the one signal of the primary reference clock signal set, configured to output one of the first local multiphase clock signals as one signal of the secondary reference clock signal set, configured to generate second local multiphase clock signals according to a part of the first local multiphase clock signals and the other signal of the primary reference clock signal set and configured to output one of the second local multiphase clock signals as the other signal of the secondary reference clock signal set.

8. The clock distribution circuit of claim 1, wherein the first local distribution circuit includes:
   a converter configured to convert the internal clock signals to a CMOS level;
   a first clock generation circuit configured to sample, according to the internal clock signals, the one signal of the primary reference clock signal set to generate the first local multiphase clock signals and configured to output one of the first local multiphase clock signals as one signal of the secondary reference clock signal set; and
   a second clock generation circuit configured to sample, according to a part of the first local multiphase clock signals, the other signal of the primary reference clock signal set to generate the second local multiphase clock signals and configured to output one of the second local multiphase clock signals as the other signal of the secondary reference clock signal set.

9. A semiconductor apparatus comprising:
   a transmission circuit coupled to a data line and an input/output pad and configured to serialize data, which is provided through the data line, by multiplexing the data according to at least one of internal clock signals, first local multiphase clock signals and second local multiphase clock signals and configured to provide the serialized data to the input/output pad;
   a global distribution circuit configured to receive external clock signals and configured to generate internal clock signals and primary reference clock signal set according to the external clock signals; and
   a first local distribution circuit configured to generate the first local multiphase clock signals according to the internal clock signals and the one signal of the primary reference clock signal set, configured to output one of the first local multiphase clock signals as one signal of the secondary reference clock signal set, configured to generate the second local multiphase clock signals according to a part of the first local multiphase clock signals and the other signal of the primary reference clock signal set and configured to output one of the second local multiphase clock signals as the other signal of the secondary reference clock signal set.

10. The semiconductor apparatus of claim 9, wherein the transmission circuit includes:
    a first multiplexing circuit configured to perform, according to the second local multiphase clock signals, a multiplexing operation on the data provided from a memory block through the data line; and
    a second multiplexing circuit configured to perform, according to the first local multiphase clock signals, a multiplexing operation on the data from the first multiplexing circuit.

11. The semiconductor apparatus of claim 10, wherein the transmission circuit further includes a third multiplexing circuit configured to perform, according to the internal clock signals, a multiplexing operation on the data from the second multiplexing circuit to output the multiplexed data to an outside of the semiconductor apparatus through the input/output pad.

12. The semiconductor apparatus of claim 9,
    further comprising a reception circuit coupled to the data line and the input/output pad, and
    wherein the reception circuit includes:
    a sampler configured to sample, according to the first local multiphase clock signals, the data provided through the input/output pad; and
    a re-timer configured to adjust, according to the second local multiphase clock signals, a timing of the data from the sampler to provide the adjusted data to the data line.

13. The semiconductor apparatus of claim 9, wherein the global distribution circuit includes:
    an internal clock generation circuit configured to buffer the external clock signals to generate the internal clock signals;
    a primary reference clock generation circuit configured to divide the external clock signals to generate the first global multiphase clock signals and configured to generate the one signal of the primary reference clock signal set according to the first global multiphase clock signals; and a secondary reference clock generation circuit configured to divide the first global multiphase clock signals to generate the second global multiphase clock signals and configured to generate the other signal of the primary reference clock signal set according to the second global multiphase clock signals.

14. The semiconductor apparatus of claim 9, wherein the first local distribution circuit includes:

a converter configured to convert the internal clock signals to a complementary metal-oxide semiconductor (CMOS) level;

a first clock generation circuit configured to sample, according to the internal clock signals, the one signal of the primary reference clock signal set to generate the first local multiphase clock signals and configured to output one of the first local multiphase clock signals as the one signal of the secondary reference clock signal set; and a second clock generation circuit configured to sample, according to a part of the first local multiphase clock signals, the other signal of the primary reference clock signal set to generate the second local multiphase clock signals and configured to output one of the second local multiphase clock signals as the other signal of the secondary reference clock signal set.

* * * * *

UNITED STATES PATENT AND TRADEMARK OFFICE
CERTIFICATE OF CORRECTION

PATENT NO. : 12,147,264 B2  
APPLICATION NO. : 18/183799  
DATED : November 19, 2024  
INVENTOR(S) : Ji Hyo Kang et al.

Page 1 of 1

It is certified that error appears in the above-identified patent and that said Letters Patent is hereby corrected as shown below:

On the Title Page

Item (54) and in the Specification, Column 1, Lines 1-4, Replace "CLOCK DISTRIBUTION CIRCUIT AND SEMICONDUCTOR APPARATUS INCLUDING THE SAME PRELIMINARY CLASS" with --CLOCK DISTRIBUTION CIRCUIT AND SEMICONDUCTOR APPARATUS INCLUDING THE SAME--

Signed and Sealed this  
Third Day of June, 2025

Coke Morgan Stewart  
*Acting Director of the United States Patent and Trademark Office*